United States Patent [19]

Lichti

[11] 4,316,056
[45] Feb. 16, 1982

[54] CONTROL CIRCUIT FOR ELECTROMAGNETICALLY-OPERATED RECORDERS IN TELEPRINTING DEVICES

[75] Inventor: Reiner Lichti, Germering, Fed. Rep. of Germany

[73] Assignee: Siemens Aktiengesellschaft, Berlin & Munich, Fed. Rep. of Germany

[21] Appl. No.: 143,200

[22] Filed: Apr. 24, 1980

[30] Foreign Application Priority Data

Jun. 1, 1979 [DE] Fed. Rep. of Germany ....... 2922521

[51] Int. Cl.³ .......................... H04L 21/00; B41J 9/10; H01H 47/32
[52] U.S. Cl. .................................... 178/23 R; 361/155
[58] Field of Search ..................... 178/23 R, 17 R, 30, 178/73–75; 101/93.02, 93.29, 93.43; 361/152, 153, 154, 166, 167, 168, 169, 245, 246, 155

[56] References Cited

U.S. PATENT DOCUMENTS

| | | | |
|---|---|---|---|
| 3,021,454 | 2/1962 | Pickens | 361/155 |
| 3,549,955 | 4/1971 | Paine | 317/148 |
| 3,582,981 | 6/1971 | Dalyai | 361/155 |
| 3,786,344 | 10/1972 | Davis et al. | 323/20 |
| 4,091,235 | 5/1978 | Nijenhuis | 178/23 R |

FOREIGN PATENT DOCUMENTS 2515124 9/1976 Fed. Rep. of Germany .
2532715 4/1979 Fed. Rep. of Germany .

Primary Examiner—Thomas A. Robinson
Attorney, Agent, or Firm—Hill, Van Santen, Steadman, Chiara & Simpson

[57] ABSTRACT

A control circuit for momentarily energizing an electromagnetic coil in a teleprinting device recorder has a pair of switching transistors respectively operated by control pulses having a lag between respective switching times and a control transistor biased by a single operating voltage source. When a first of the switching transistors is switched on a rapid current rise in the coil takes place for immediate and rapid activation of the coil plunger which is followed by a maintenance time during which the first switching transistor is either switched off or is in pulsed operation and also during which the energy stored in the electromagnetic coil serves as the maintenance current source, which is followed by switching on of the second control transistor. By the addition of a diode between the coil and the operating voltage source, a feedback circuit is formed so that after disconnection of the electromagnetic coil, the energy stored in the coil is fed back into the operating currents supply network.

5 Claims, 4 Drawing Figures

CONTROL CIRCUIT FOR ELECTROMAGNETICALLY-OPERATED RECORDERS IN TELEPRINTING DEVICES

BACKGROUND OF THE INVENTION

1. Field of the Invention

The present invention relates to circuits for electromagnetic coil-operated devices, and in particular for the control of drive coils in recorders for teleprinting devices.

2. Description of the Prior Art

In recording of information in readable form as well as in the plotting of information on carriers in the form of punched tapes, drive circuits including electromagnetic coils are widely known and utilized for momentary activation of individual recording elements such as a typeface or a tapepunching needle. Such devices are utilized in teleprinters which record information manually entered or received from a transmission line.

In the particular application of matrix printers, a particular matrix pattern is associated with each information character and selected needles in a corresponding needle matrix are individually activated by associated electromagnetic coils to move from a rest position into a printing position to mark or punch a hole in a moving paper tape. Each individual printing needle has a electromagnetic system associated with it which controls the movement of that particular printing needle against the writing surface. For the orderly and rapid operation of the printer, the electromagnetic system must embody a short activation time during which the coil is energized sufficiently to move the needle, a fast release time for returning the needle to a rest position, and moreover must have a low energy requirement.

An electromagnetic coil drive circuit suitable for use in such printers is known from German AS No. 2,515,124. In this arrangement, the coil of each electromagnet is in series with two switching transistors which are sequentially activated by two control pulses which have adjustable duty cycles. The circuit further requires the use of two separate voltage sources which are necessitated because the switching transistors are driven separately in time and act upon the magnetic coil first with a high voltage in order to quickly generate the necessary magnetic field to move the plunger, followed by supply of a second lower voltage to the coil as a maintenance current. The maintenance current exhibits essentially a current curve which is typical for a current constant circuit. Circuits of this type operate adequately, but require an undesired outlay because of the necessity of having two separate voltage sources. Moreover, the constant connection and disconnection of the voltage sources in such circuits leads to substantial heat losses and consequently a thermal load requiring a heat sink or other cooling devices.

SUMMARY OF THE INVENTION

It is an object of the present invention to provide a control circuit useable in teleprinters having printing elements operated by electromagnetic coils which has a fast start up time and disconnection time and has a low energy consumption and functions with the use of a single voltage source.

It is another object of the present invention to provide such a circuit in which minimization of the thermal load is achieved which results from disconnection of the individual coils.

The above objects are inventively achieved in a control circuit including two switching transistors respectively controlled by pulse signals, one of which has a duty time lagging the duty time of the other so that the first switching transistor is operated during the start up time for rapid energization of the electromagnetic coil and is either disconnected or switched to a pulsed operation for generation of a maintenance current, which may also be achieved by the subsequent switching-on of the second switching transistor. The coil is energized by a control transistor operating with a single bias voltage. The maintenance current is provided by the coil itself which is allowed to discharge its inductively stored current.

In a second embodiment of the invention, the coil is connected through a diode to the bias voltage source network so that the inductive current from the coil can be fed back to the voltage source network thereby minimizing heat production.

The above-described circuit requires only a single operating voltage because the energy required for the maintenance current is also supplied by the magnetic coil inductance and moreover exhibits substanitally minimized heat production thereby simplifying associated cooling devices required with conventional control circuitry.

DESCRIPTION OF THE PREFERRED EMBODIMENTS

Figure 1:
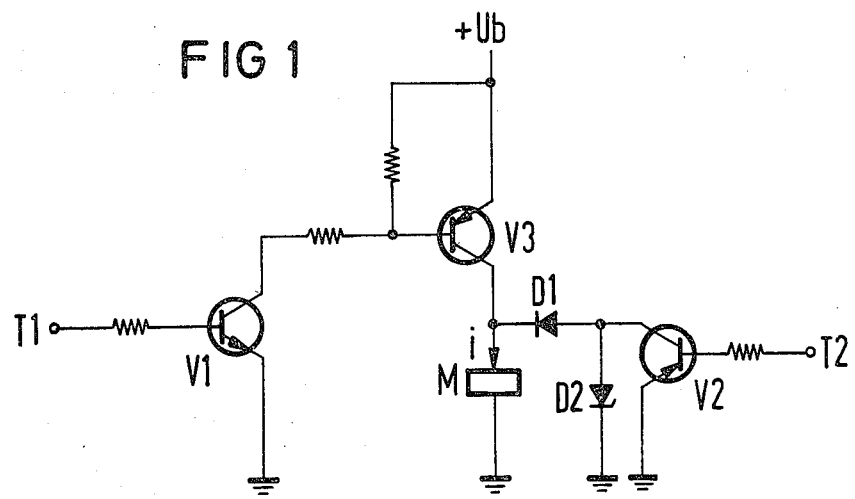
FIG. 1 is a schematic illustration of a control circuit constructed in accordance with the principles of the present invention.

A control circuit suitable for control of electromagnetic coil-operated teleprinting devices such as writing needles or hold punching needles is shown in FIG. 1. The circuit includes a pair of switching transistors V1 and V2 which are respectively operated by signals T1 and T2 applied to the base of each transistor through a suitable resistor. The respective emitters of each transistor are connected to ground. In the embodiment shown in FIG. 1, transistor V1 is an n-p-n transistor and transistor V2 is a p-n-p transistor, although it will be understood to those skilled in the art that the polarity of the transistors may be varied in accordance with the available input signals T1 and T2.

The circuit of FIG. 1 further includes a control transistor V3 having its emitter connected to a single operating voltage $+U_b$. The base of the transistor V3 is connected to the collector of transistor V1 through a suitable resistor and the emitter of transistor V3 is connected to an electromagnetic coil M. The collector of the switching transistor V2 is also connected to the coil M, but through a diode D1. A zener diode D2 is connected to ground across the collector of the switching transistor V2.

The manner of operation of the circuit of FIG. 1 will be explained in detail with the use of the control signals T1 and T2 shown in FIG. 2, which also illustrates the current i in the electromagnetic coil M during a cycle of operation.

Figure 2:
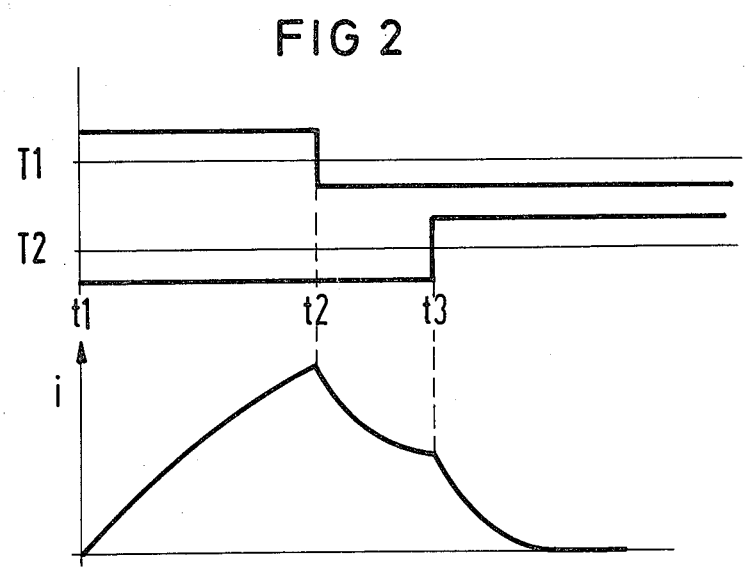
FIG. 2 is a graphic representation of control pulses which may be applied to the circuit of FIG. 1, and further illustrates the current i in the coil during an operation cycle.

By application of the control signals T1 and T2 shown in FIG. 2 to the respective bases of switching transistors V1 and V2, both of those transistors are conducting. Because transistor V1 is conducting, the control transistor V3 becomes conducting as well so that the coil M of a particular needle to be moved is connected to the operating voltage +Ub. While so connected, the current i in the coil rises in the manner shown in FIG. 2 until reaching a peak level at a time t2 when the first control signal switches or is disconnected. With the change of state of the first signal T1 at the time t2, the first switching transistor V1 and the control transistor V3 are non-conducting so that the coil M is disconnected from the operating voltage +Ub.

The second switching transistor V2 is still conducting, however, and a maintenance circuit is thus formed consisting of the transistor V2 and the diode D1 so that the current flow as shown in FIG. 2 between times t2 and t3 is maintained. The inductance of the coil M, i.e., the inductively stored energy therein, serves as a current source for delivering the maintenance current during this portion of the cycle.

At a further time t3 the second control signal T2 changes state so that the second switching transistor V2 becomes non-conducting so that the maintenance circuit for the coil M is interrupted. The zener diode D2 connected across the collector of the transistor V2 limits the disconnection voltage and moreover takes up the energy still stored in the coil at the time of disconnection so that a further current decrease back to an essentially zero level as shown in FIG. 2 results.

It will be understood to those skilled in the art that although the circuit arrangement of FIG. 1 shows only a single magnetic coil M, the circuit may be utilized with any number of coils with the addition of a transistor V2 and a diode D1 for each added coil.

Figure 3:
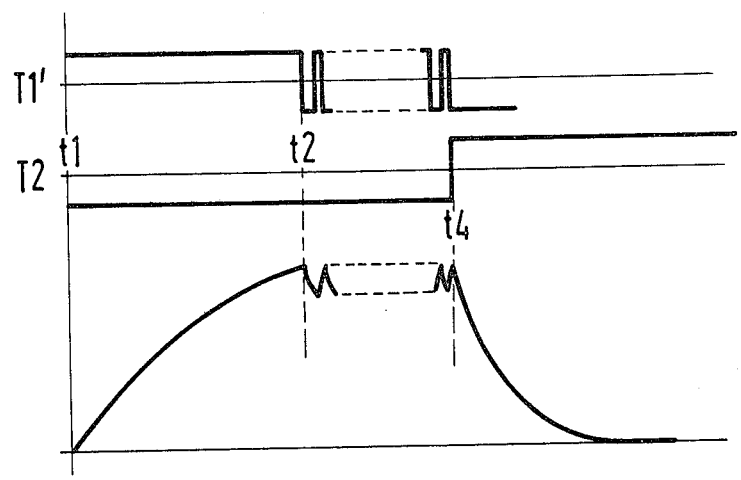
FIG. 3 is a graphic representation of an alternative pulse which may be supplied to the circuit of FIG. 1 and the corresponding coil current i which results therefrom.

The circuit of FIG. 1 may be operated in a slightly different manner still within the scope of the inventive concept disclosed herein by application of the pulsed control signal T1' as shown in FIG. 3 in place of the signal T1. Application of the signal T1' insures that a specified current level will be maintained between times t2 and t4 for applications wherein it is necessary to prevent the maintenance current from dropping below a predetermined value. Application of the control signal T1' causes the control transistor V3 to be periodically connected and disconnected through the first switching transistor V1 during the maintenance phase of operation. Operation is otherwise the same as previously described in connection with FIGS. 1 and 2. The switching transistors V1 and V2 are conducting upon application of the control pulses T1' and T2 and the current i in the coil M rises to a peak value during the start up time from t1 to t2. Upon reaching the time T2, the first control signal T1' is periodically pulsed or periodically connected and disconnected resulting in the sawtooth curve for the current i in FIG. 3. Upon a final change of state of the first control signal T1' or a disconnection thereof the final blocking of the switching transistors V1 and V2 results at time t4. The rapid current drop then takes place as shown in FIG. 3. The stability of the current i in this manner of operation can be controlled by the frequency of pulsing of the first control signal T1'.

In the circuit shown in FIG. 1, the disconnect voltage is limited by means of the zener diode D2 which also absorbs the energy stored in the coil M at the time of disconnection. A modification can be made to the circuit of FIG. 1 as shown in FIG. 4 by which the energy which is stored in the coil at the time of disconnection is fed back into the operating voltage network which leads to a reduction of the thermal load resulting from rapid connection and disconnection of the coil.

As shown in FIG. 4, again two switching transistors V1 and V2 are utilized which are controllable by the control pulses T1 and T2 shown in FIG. 2 or the control pulses T1' and T2 shown in FIG. 3.

Figure 4:
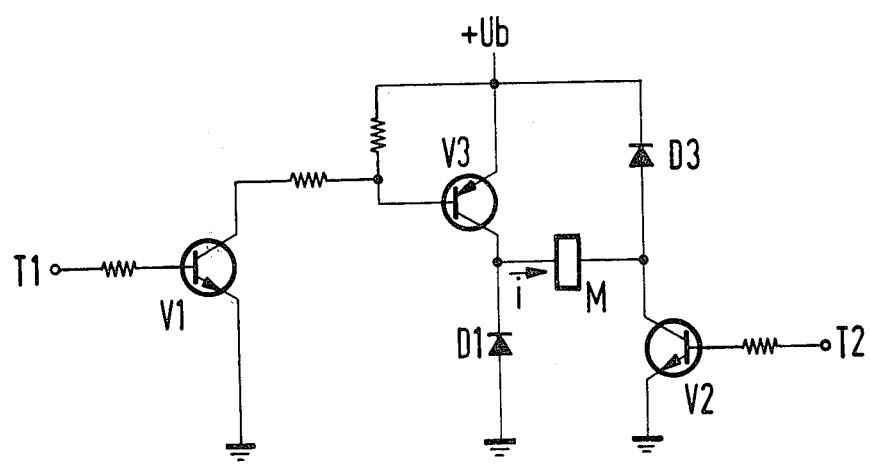
FIG. 4 is a second embodiment of the control circuit of FIG. 1 adapted to feedback current to the bias voltage network.

The coil M of the electromagnetic is again connected to the collector of the control transistor V3 and the collector of the second switching transistor V2, however in the embodiment shown in FIG. 4 the diode D1 is connected to ground between the coil M and the collector of the control transistor V3.

To feed back the energy which is stored in the coil M upon disconnection at either times t3 or t4, a third diode D3 is provided which is connected at a point between the coil M and the collector of the second switching transistor V2 and when conducting connects that point to the voltage source network at the terminal at which the voltage +Ub is provided. Therefore, in the embodiment of FIG. 4 the maintenance circuit consists of the diode D1, the coil M and the second switching transistor V2. The circuit operates as follows. During the start up timt t1 to t2, both switching transistors V1 and V2 are conducting and the coil M is connected through the control transistor V3 to the supply voltage +Ub. Upon the beginning of the maintenance phase of an operational cycle at time t2, the first control signal T1 or T1' changes state so that the first switching transistor V1 and the control transistor V3 are either permanently disconnected to periodically connected and disconnected. While the control transistor V3 is in a non-conducting state, current flow is maintained in the coil M through the diode D1 and the still-conducting second switching transistor V2. Upon the beginning of the disconnect phase of operation, all transistors V1, V2 and V3 are in a non-conducting state and the energy stored inductively in the coil M is now fed back to the voltage network through the diodes D1 and D3, which are now conducting, into the voltage supply network.

The switching circuit shown in FIG. 4 is particularly well suited for control of electromagnetic coils in teleprinters using hole-punching devices because such devices have a large amount of inductive energy stored in the electromagnetic coils during operation.

Such feedback can proceed in any type of positive operating voltage networks employing the same signal polarities as shown in FIGS. 2 and 3 as well as in negative or bipolar operating voltage networks, for which it is only necessary to connect the diodes D1 and D3 in a manner corresponding to the polarity of the voltage utilized.

As in the circuit of FIG. 1, the circuit of FIG. 4 can be adapted to drive many electromagnetic coils with the addition of a transistor V2 and a diode D3 for each additional coil M.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A circuit for controlling an electromangetic coil-operated device comprising:

first and second switching transistors respectively operated by first and second base-supplied control signals, each control signal having at least one change-of-state with the change of state of said second control signal occurring after the change of state of said first control signal;

a control transistor connected between said coil and an operating voltage source and connected at its base to said first switching transistor for selective energization of said coil when said first switching transistor is conducting; and a first diode connected between the collector of said second switching transistor and said coil, whereby current inductively stored in said coil before said change of state of said first control signal flows through said diode as a maintenance current between said change of state of said first control signal and said change of state of said second control signal and whereby said change of state of said second control signal disconnects said coil.

2. The control circuit of claim 1 wherein said first control signal is periodically connected and disconnected for a period immediately preceding said change of state of said second control signal to maintain a minimum maintenance current for said period.

3. The circuit of claim 1 further comprising a zener diode connected to ground across the collector of said second switching transistor for regulating the current drop in said coil after disconnection thereof after said change of state of said second control signal.

4. A circuit for controlling an electromagnetic coil-operated device comprising:

first and second switching transistors respectively operated by first and second base-supplied control signals, each control signal having at least one change-of-state with the change of state of said second control signal occurring after the change of state of said first control signal;

a control transistor connected between said coil and an operating voltage source and connected at its base to said first switching transistor for selective energization of said coil when said first switching transistor is conducting, said second switching transistor connected to said coil at its collector;

a first diode connected between ground and a point between said control transistor collector and said coil; and a second diode connected between said operating voltage source and a point between said second switching transistor collector and said coil, whereby current flow in said coil is maintained after said change-of-state of said first control signal by flow of inductively stored current in said coil through said first and second diodes in a feedback path to said operating voltage source.

5. The control circuit of claim 4 wherein said first control signal is periodically connected and disconnected for a period immediately preceding said change of state of said second control signal to maintain a minimum maintenance current for said period.

* * * * *